(12) United States Patent
Kubota et al.

(10) Patent No.: US 11,322,384 B2
(45) Date of Patent: May 3, 2022

(54) SUBSTRATE PROCESSING APPARATUS AND SUBSTRATE PROCESSING METHOD

(71) Applicants: SHIN-ETSU ENGINEERING CO., LTD., Tokyo (JP); SHIBAURA MECHATRONICS CORPORATION, Yokohama (JP)

(72) Inventors: Shunya Kubota, Yokohama (JP); Emi Matsui, Yokohama (JP); Katsuhiro Yamazaki, Yokohama (JP); Yoshikazu Ohtani, Annaka (JP); Kyouhei Tomioka, Annaka (JP)

(73) Assignees: SHIN-ETSU ENGINEERING CO., LTD., Tokyo (JP); SHIBAURA MECHATRONICS CORPORATION, Yokohama (JP)

( * ) Notice: Subject to any disclaimer, the term of this patent is extended or adjusted under 35 U.S.C. 154(b) by 45 days.

(21) Appl. No.: 17/034,173

(22) Filed: Sep. 28, 2020

(65) Prior Publication Data
US 2021/0098279 A1    Apr. 1, 2021

(30) Foreign Application Priority Data
Sep. 30, 2019    (JP) .............................. JP2019-180844

(51) Int. Cl.
*H01L 21/67*    (2006.01)
*H01L 21/683*    (2006.01)

(52) U.S. Cl.
CPC ...... *H01L 21/6836* (2013.01); *H01L 21/6715* (2013.01); *H01L 21/67051* (2013.01); *H01L 2221/68327* (2013.01)

(58) Field of Classification Search
CPC ................................................ H01L 21/67051
See application file for complete search history.

(56) References Cited

U.S. PATENT DOCUMENTS

| 9,972,521 B2 | 5/2018 | Nakajima |
| 2015/0380291 A1 | 12/2015 | Nakajima |

FOREIGN PATENT DOCUMENTS

| JP | 6004100 B2 | 10/2016 | |
| WO | WO-2012111359 A1 * | 8/2012 | ............. B82Y 40/00 |

* cited by examiner

*Primary Examiner* — Selim U Ahmed
*Assistant Examiner* — Evan G Clinton
(74) *Attorney, Agent, or Firm* — Oblon, McClelland, Maier & Neustadt, L.L.P.

(57) ABSTRACT

According to one embodiment, a substrate processing apparatus and a substrate processing method that can improve the quality of substrates are provided. The substrate processing apparatus according to one embodiment includes: a table 20 configured to support a processing target W including a substrate W1, a ring W2 surrounding a surrounding of the substrate W1, and a dicing tape W3 adhered to a lower surface of the substrate W1 and a lower surface of the ring W2, and a liquid supplier 50 configured to eject a liquid which does not mix with a processing liquid for processing the substrate W1 and which has a specific gravity heavier than the processing liquid to one of an upper surface of the ring W2 of the processing target W supported by the table 20 rotating by the rotation mechanism 30, an outer circumference end portion of the substrate W1 of the processing target W supported by the table 20 rotating by the rotation mechanism 30, and between the substrate W1 and the ring W2 of the processing target W supported by the table 20 rotating by the rotation mechanism in accordance with a rotation number of the table 20 to supply the liquid between the substrate W1 and the ring W2 of the processing target W.

12 Claims, 8 Drawing Sheets

| STEP | Processing Method | DIW Processing by First Nozzle | DIW Processing by Second Nozzle | Number of Rotation of Table (rpm) | Processing Time (s) |
|---|---|---|---|---|---|
| 1 | - | 380 ml/min | - | 20 | 10 |
| 2 | Solvent | 380 ml/min | - | 20 | 240 |
| 3 | Solvent | 380 ml/min | 200 ml/min | 400 | 60 |
| 4 | IPA | - | - | 400 | 60 |
| 5 | DRY | - | - | 1000 | 50 |
| 6 | DRY | - | - | 50 | 10 |

*Fig. 3*

| Number of Rotation | Nozzle Angle relative to Rotation Direction | Nozzle Angle relative to Central Direction |
|---|---|---|
| First Number of Rotation (Slow) |  |  |
| Second Number of Rotation (Fast) |  |  |

SUBSTRATE PROCESSING APPARATUS AND SUBSTRATE PROCESSING METHOD

CROSS-REFERENCE TO RELATED APPLICATION

This application is based upon and claims the benefit of priority from Japan Patent Application No. 2019-180844, filed on Sep. 30, 2019, the entire contents of which are incorporated herein by reference.

TECHNICAL FIELD

Embodiments of the present disclosure relate to a substrate processing apparatus and a substrate processing method.

PRIOR ART

In recent years, further thinning and reduction of cost are required for semiconductor devices. Therefore, semiconductors have been collectively manufactured by placing them on a substrate to support the semiconductor devices. As the substrates to support semiconductor devices (supporting substrates), for example, wafers for semiconductors and glass substrates for liquid crystal panels are used, and various processing such as wiring formation, chip placement, and molds sealing are performed on an adhesive layer of the supporting substrate to form semiconductor devices on the adhesive layer. Then, the supporting substrate are peeled off from the formed semiconductor devices. In the process of the supporting substrate, for example, the adhesive layer between the semiconductor devices and the supporting substrate are deteriorated by the laser irradiation to peel off the supporting substrate from the semiconductor devices.

Before the peeling process, to ultimately separate the semiconductor devices into individual chips, dicing tape that is adhesive tape is pasted on surfaces of the adhesive layer on the surface at the semiconductor device-side that is opposite the supporting substrate. A ring for transport and support is pasted on the dicing tape so as to surround the supporting substrate and the semiconductor device on the dicing tape. Therefore, the center region of the adhesive surface (surface that has adhesiveness) of the dicing tape is covered by the supporting substrate and the semiconductor device, and the outer edge region of the adhesive surface of the dicing tape is covered by the circular ring. The circular region between the center region and the outer edge region of the adhesive surface of the dicing tape (the adhesive surface of the dicing tape between the semiconductor device and the ring) is exposed.

After the supporting substrate is peeled off from the semiconductor devices by the peeling process, only the semiconductor devices are pasted on the dicing tape. Furthermore, since the semiconductor devices are formed on the supporting substrate, the semiconductor devices that are collectively formed are formed in the same contour as the supporting substrate. That is, in the case the supporting substrate is the wafer for semiconductor, the contour of the semiconductor devices would have the disc-shape as the wafer for semiconductor. Hereinafter, the semiconductor devices that are formed in the disc-shape would be described as an example. In addition, the semiconductor devices would be simply referred to as the devices (or the substrates).

When the supporting substrate is peeled off from the devices, adhesive (for example, carbon) that is the adhesive layer remains on the devices. Therefore, it is required to remove the remaining adhesive from the devices. In the removal process of the adhesive, for example, the ring is pushed from above by a plurality of chuck pins (fixation members) to fix the device to a table together with the ring and the dicing tape. Then, the device is rotated in the horizontal plane together with the ring and the dicing tape with the center of the device as the central axis, a cleaning liquid (an example of the processing liquid) such as solvent is supplied around the center of the device, and the cleaning liquid supplied around the center of the device is spread to the entire device (circumferential direction) and is discharged from the device to remove the adhesive from the device.

Although the adhesive removed from the devices is discharged from the devices together with the cleaning liquid, the discharged adhesive may be stuck to the adhesive surface of the dicing tape between the discharged adhesive and the ring. If the adhesive is stuck to said surface, the adhesive may leave the dicing tape and may stick to the devices such that the devices (substrates) may be contaminated in the carrying process or the dicing process, etc., resulting in the deterioration of the quality of devices that is the quality of the substrates.

SUMMARY

Problems to be Solved by the Invention

The problems to be solved by the present disclosure are to provide a substrate processing apparatus and a substrate processing method that can improve the quality of substrates.

Means to Solve the Problems

A substrate processing apparatus according to embodiments of the present disclosure includes:

A table that supports a processing target including a substrate, a ring surrounding a surrounding of the substrate, and a dicing tape adhered to a lower surface of the substrate and a lower surface of the ring;

A rotation mechanism that rotate the table in a plane;

A liquid supplier that ejects a liquid which does not mix with a processing liquid for processing the substrate and which has a specific gravity heavier than the processing liquid to one of an upper surface of the ring of the processing target supported by the table rotating by the rotation mechanism, an outer circumference of the substrate of the processing target supported by the table rotating by the rotation mechanism, and between the substrate and the ring of the processing target supported by the table rotating by the rotation mechanism in accordance with a rotation number of the table to supply the liquid between the substrate and the ring of the processing target; and A processing liquid supplier that supplies the processing liquid to an upper surface of the substrate of the processing target supported by the table rotating by the rotation mechanism in a state the liquid has been supplied between the substrate and the ring of the processing target by the liquid supplier.

A substrate processing method according to embodiments of the present disclosure includes:

A process of supporting a processing target including a substrate, a ring surrounding a surrounding of the substrate, and a dicing tape adhered to a lower surface of the substrate and a lower surface of the ring by a table;

A process of rotating the table in a plane by a rotation mechanism;

A process of ejecting a liquid which does not mix with a processing liquid for processing the substrate and which has a specific gravity heavier than the processing liquid to one of an upper surface of the ring of the processing target supported by the table rotating by the rotation mechanism, an outer circumference of the substrate of the processing target supported by the table rotating by the rotation mechanism, and between the substrate and the ring of the processing target supported by the table rotating by the rotation mechanism in accordance with a rotation number of the table to supply the liquid between the substrate and the ring of the processing target by a liquid supplier; and A process of supplying the processing liquid to an upper surface of the substrate of the processing target supported by the table rotating by the rotation mechanism in a state the liquid has been supplied between the substrate and the ring of the processing target by the liquid supplier by a processing liquid supplier.

Effect of the Invention

According to embodiments of the present disclosure, the quality of the substrate can be improved.

BRIEF DESCRIPTION OF DRAWINGS

FIG. 3 is a diagram describing a substrate processing process according to the first embodiment.

EMBODIMENTS

First Embodiment

A first embodiment is described with the reference to FIGS. 1 to 5.

(Basic Configuration)

Figure 1:
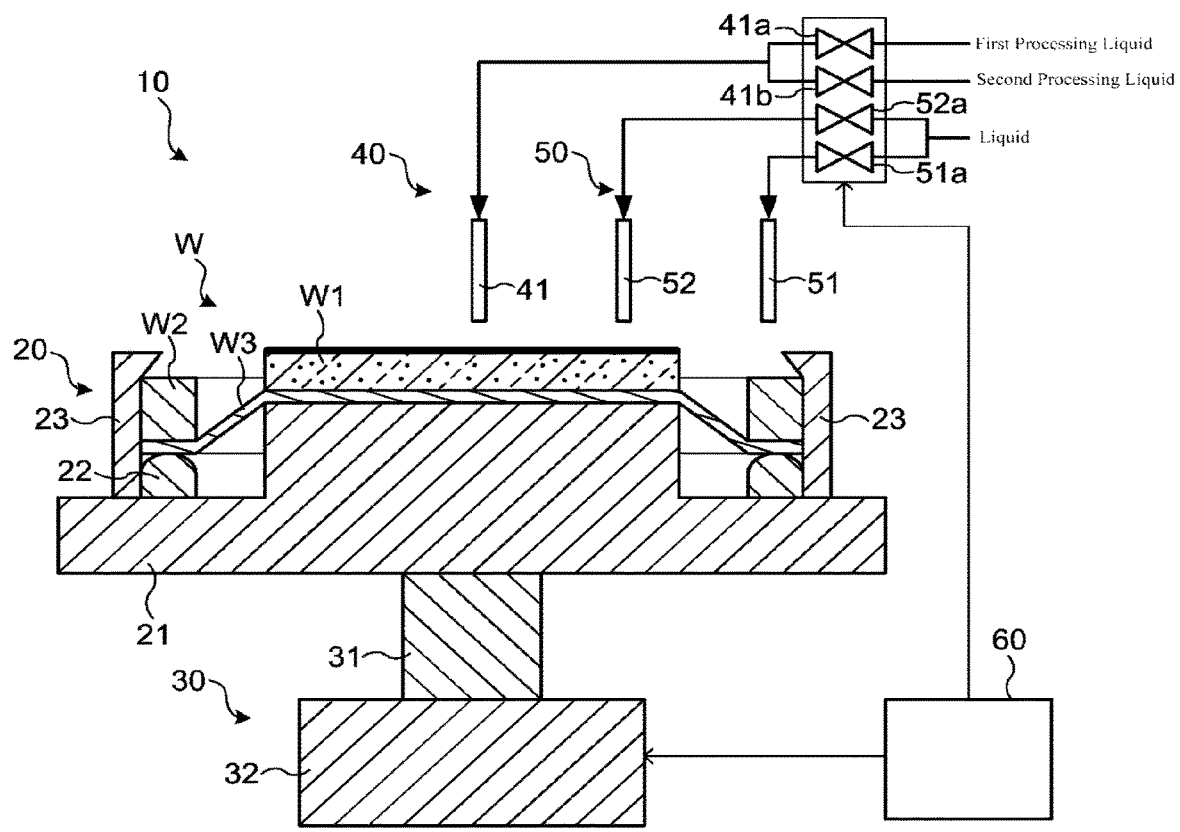
FIG. 1 is a diagram illustrating a schematic configuration of a substrate processing apparatus according to a first embodiment.

As illustrated in FIG. 1, a substrate processing apparatus 10 according to a first embodiment includes a table 20, a rotation mechanism (rotation driver) 30, a processing liquid supplier 40, a liquid supplier 50, and a controller 60.

Figure 2:
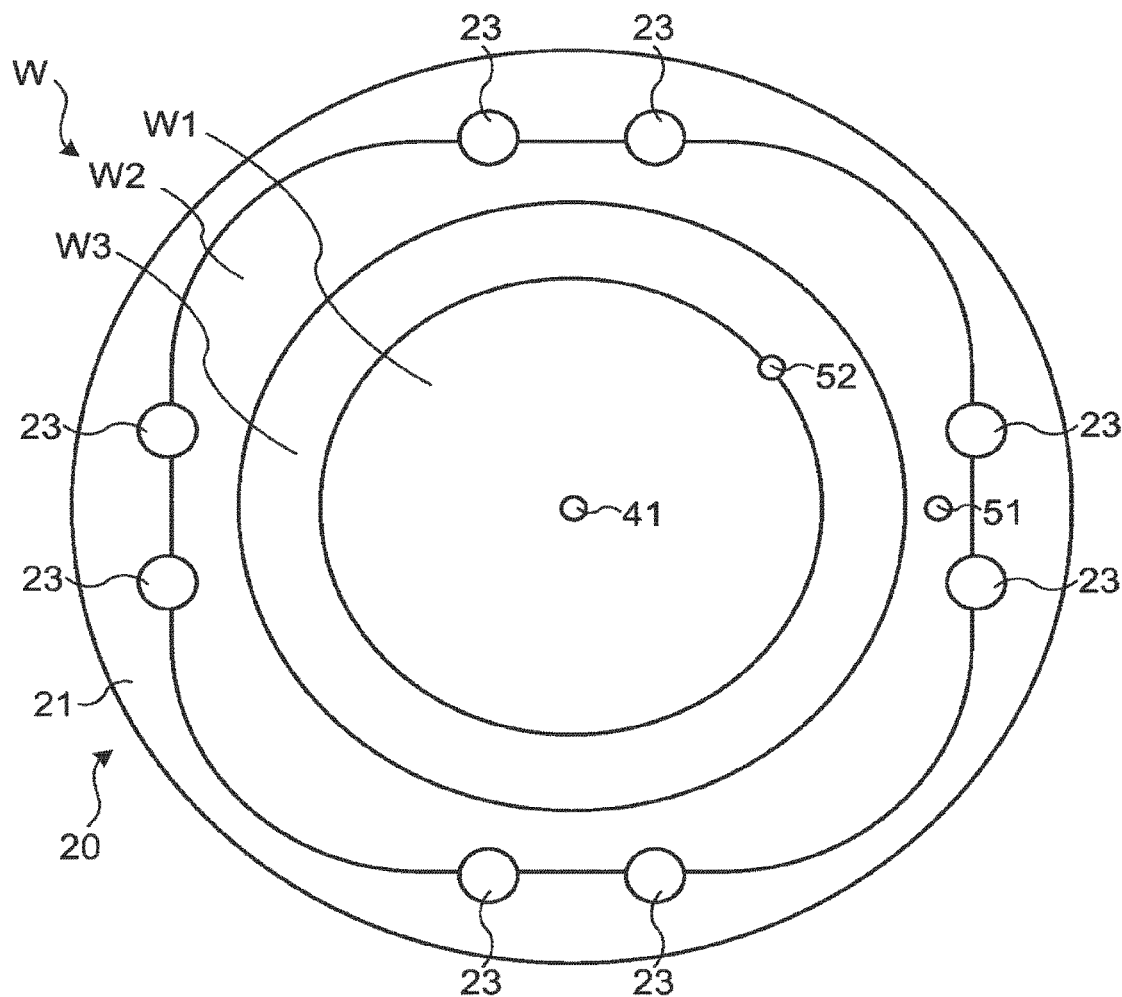
FIG. 2 is a plan view illustrating a part of the substrate processing apparatus according to the first embodiment.

As illustrated in FIGS. 1 and 2, a processing target W includes a substrate (for example, device) W1, a ring W2, and a dicing tape W3. The substrate W1 is pasted on a center of the dicing tape W3. The ring W2 is circular and is pasted on the dicing tape W3 so as to surround a surrounding of the substrate W1 on the dicing tape W3. Therefore, a central region of a adhesive surface of the dicing tape W3 is covered by the substrate W1, and the outer edge region of the adhesive surface of the dicing tape W3 is covered by the ring W2. Accordingly, the circular region between the central region and the outer edge region of the adhesive surface of the dicing tape W3, that is, an upper surface of the dicing tape W3 between the substrate W1 and the ring W2 is exposed.

The table 20 includes a main body 21, a support 22, and a plurality of chuck pins 23. The table 20 is surrounded by a cup (not illustrated) and is positioned approximately at a center in the cup, and is provided on the rotation mechanism 30 rotatably in the horizontal plane. For example, the table 20 is called a spin table.

The main body 21 is formed in a convex-shape which a center thereof rises in a cylindrical shape. An upper surface of the convex-shape of the main body 21 supports the substrate W1 in a state opposing a lower surface of the substrate W1 of the processing target W via the dicing tape W3. The support 22 is circular and is provided in a circular plane portion of the main body 21 so as to surround the convex-shape (protruding portion) of the main body 21. The support 22 supports the ring W2 in a state opposing a lower surface of the ring W2 of the processing target W via the dicing tape W3. Each chuck pins 23 is provided to the circular plane portion of the main body 21 eccentrically rotatably. The chuck pins 23 each synchronously eccentrically rotates to support the processing target W horizontally while inwardly pushing an outer circumference surface of the ring W2 of the processing target W. At this time, the center of the processing target W is positioned on the rotation axis of the table 20.

The table 20 supports the processing target W by the main body 21 and the support 22, and fixes the main body 21 and the support 22 by the chuck pins 23 to support the processing target W such that a height of an upper surface of the ring W2 of the processing target W is lower than a height of an upper surface of the substrate W1 (for example, for several millimeters about 2 mm).

The rotation mechanism 30 is provided to support the table 20 and is configured to rotate the table 20 in the horizontal plane (which is an example of a plane). The rotation mechanism 30 includes a rotation axis 31 and a motor 32. One end of the rotation axis 31 is connected to a lower center of the table 20, and the other end of the rotation axis 31 is connected to the motor 32. The motor 32 rotates the rotation axis 31. The rotation mechanism 30 rotates the table 20 in the horizontal plane via the rotation of the rotation axis 31 driven by the motor 32.

The processing liquid supplier 40 includes a nozzle 41. The processing liquid supplier 40 positions the nozzle 41 near an upper center of the substrate W1 of the processing target W on the table 20 (for example, near right above the center of the substrate W1), and supplies a first processing liquid (for example, solvent such as p-menthane and cyclopentanone) and a second processing liquid (for example, IPA: isopropyl alcohol) from the nozzle 41 near the center of the substrate W1 of the processing target W on the table 20. Note that the first processing liquid is, for example, a liquid which is incompatible with DIW (ultrapure water) and is a liquid for peeling off adhesives remaining on the substrate W1.

The nozzle 41 is, for example, formed movably in the horizontal direction along the processing target W on the table 20 above the table 20 by the nozzle moving mechanism (unillustrated). As the nozzle moving mechanism, for example, a swinging mechanism or a linear guide which have an arm may be used. The nozzle 41 opposes near the center of the processing target W on the table 20 and ejects the processing liquid near said center. Two types of the processing liquid are supplied to the nozzle 41 from two tanks (unillustrated) outside the substrate processing apparatus 10. An ejection amount of the first processing liquid ejected from the nozzle 41 is changed by the opened level adjustment by an adjustment valve 41*a*, and an ejection amount of the second processing liquid ejected from the nozzle 41 is changed by the opened level adjustment by an adjustment valve 41*b*.

The liquid supplier 50 includes a first nozzle 51 and a second nozzle 52. The liquid supplier 50 positions the first nozzle 51 above the upper surface of the ring W2 of the processing target W on the table 20 (for example, right above the upper surface of the ring W2) and supplies liquid (for example, DIW) to the upper surface of the ring W2 from the first nozzle 51. Furthermore, the liquid supplier 50 positions the second nozzle 52 above an outer circumference end portion of the substrate W1 of the processing target W on the table 20 (for example, right above an outer circumference surface of the ring W2) and supplies liquid (for example, DIW) to the outer circumference end portion of the substrate W1 on the table 20 from the second nozzle 52. The liquid which does not mix with the first processing liquid and which has a specific gravity heavier than the first processing liquid (which has a density larger than the first processing liquid).

The first nozzle 51 and the second nozzle 52 are, for example, each formed movably in the horizontal direction along the processing target W on the table 20 above the table 20 by the nozzle moving mechanism (unillustrated). As the nozzle moving mechanism, for example, a swinging mechanism or a linear guide which have an arm may be used. The first nozzle 51 opposes the upper surface of the ring W2 of the processing target W on the table 20 and ejects the liquid on said upper surface. The second nozzle 52 opposes the outer circumference end portion of the substrate W1 of the processing target W on the table 20 and ejects the liquid on said outer circumference end portion. The horizontal separation distance between the first nozzle 51 and the second nozzle 52 is, for example, approximately 200 mm. The liquid is supplied to the first nozzle 51 and the second nozzle 52 from a tank (unillustrated) outside the substrate processing apparatus 10. An ejection amount of the liquid ejected from the first nozzle 51 is changed by the opened level adjustment by an adjustment valve 51*a*, and an ejection amount of the liquid ejected from the second nozzle 52 is changed by the opened level adjustment by an adjustment valve 52*a*.

The controller 60 includes a microcomputer to collectively control each component and a storage to store substrate processing information and various programs, etc., related to the substrate processing. The controller 60 controls a processing target holding operation by each chuck pin 23 of the table 20, a rotation operation of the table 20 by the rotation mechanism 30, a processing liquid supplying operation by the processing liquid supplier 40, and a liquid supplying operation by the liquid supplier 50, etc. For example, the motor 32 is electrically connected to the controller 60, and a driving thereof is controlled by the controller 60. Furthermore, the adjustment valves 41*a*, 41*b*, 51*a*, and 52*a* are, for example, solenoid valves, and driving thereof are controlled by the controller 60.

(Substrate Processing Process)

Next, a flow of a substrate processing process performed by the aforementioned substrate processing apparatus will be described. The substrate processing process is a process to remove an adhesive remaining on the substrate W1 of the processing target W. Note that each value in below are merely an example.

As illustrated in FIG. 3, for example, processes of steps 1 to 6 are continuously performed. Solvent (a example of the cleaning liquid) is used as the first processing liquid, IPA is used as the second processing liquid, and DIW is used as the liquid. Note that the processing target W is fixed to the table 20 by each chuck pin 23, and the table 20 rotating during the substrate processing process. A rotation number of the table 20 and a processing time are changed by the controller 60. Furthermore, each ejection amount of solvent, IPA, and DIW is controlled and changed by the adjustment valve 41*a*, 42*b*, 51*a*, and 52*b* by the controller 60.

In step 1, DIW is ejected from the first nozzle 51 and is supplied on the upper surface of the ring W2 of the processing target W on the rotating table 20. In step 1, the ejection amount of DIW ejected from the first nozzle 51 is 380 ml/min, the rotation number of the table 20 (first rotation number) is 20 rpm, and the processing time (ejection time) is 10 s.

It is desirable that the ejection amount of DIW is an amount that can cover the upper portion of the chuck pins 23 and the surrounding of the chuck pins 23 and is an amount that is not supplied on the substrate W1. Furthermore, the rotation number (rotation speed) of the table 20 is set to be the rotation speed that can hold DIW in the form of liquid film. DIW reaches the upper surface of the ring W2 of the processing target W on the rotating table 20 and spreads over the upper surface of the ring W2. At this time, the ring W2 is rotating, and DIW supplied on the ring W2 spreads to the inner side and the outer side of the ring W2. The rotation number of the table 20 per a unit time at this time, that is, a rotation number of the ring W2 of the processing target W per a unit time (first rotation number) is set such that DIW ejected from the first nozzle and reached the upper surface of the ring W2 of the processing target W flows between the substrate W1 and the ring W2 of the processing target W supported by the rotating table 20, because it is a rotation number that has weak centrifugal force on the upper surface of the ring W2. Furthermore, the processing time is set to be a time required for DIW to cover the substrate W1 and the ring W2 based on the ejection amount. For example, when the ejection amount of set DIW is 380 ml/min, the processing time is 10 s. The ejection amount of DIW, and the rotation number and the processing time of the table 20 is obtained and set beforehand by experiment.

Figure 4:
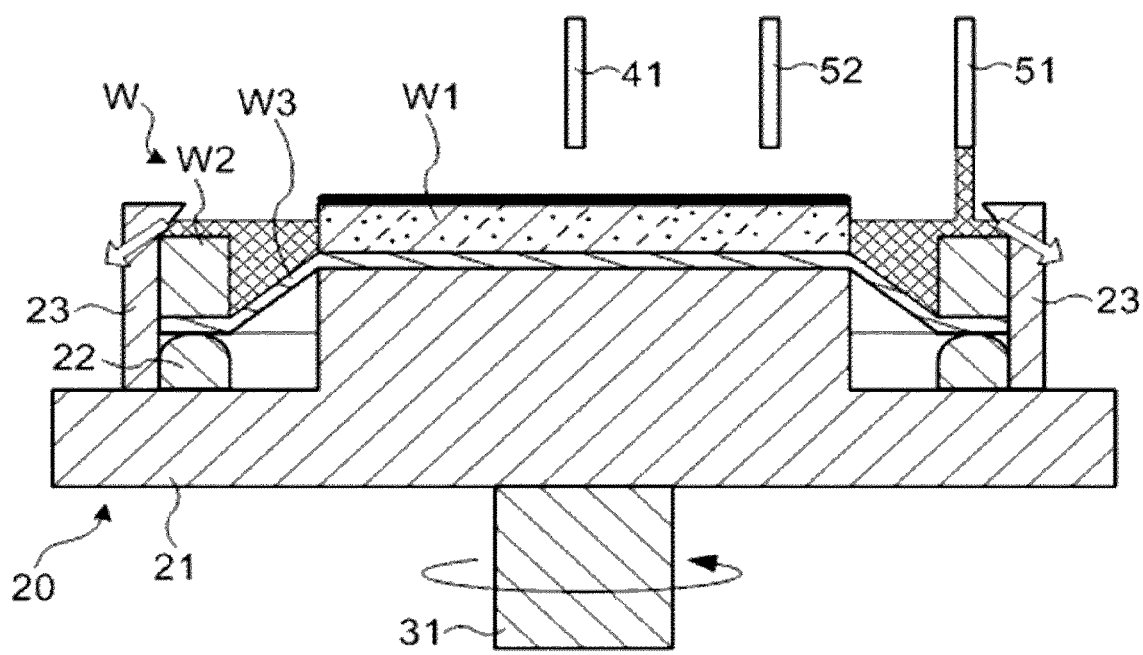
FIG. 4 is a first diagram describing a liquid supplying according to the first embodiment.

In step 1, as illustrated in FIG. 4, DIW ejected from the first nozzle 51 (indicated by filled region by cross hatching in FIG. 4) reaches the upper surface of the ring W2 of the processing target W on the rotating table 20 and spreads to the inner side (the substrate W1 side) and the outer side of the ring W2. Therefore, DIW spreading to the inner side of the ring W2 flows between the substrate W1 and the ring W2 and accumulates in a circular space surrounded by the substrate W1, the ring W2, and the dicing tape W3. Accordingly, a liquid film of DIW is formed on the adhesive surface of the dicing tape W3 between the substrate W1 and the ring W2, and the liquid film of DIW is also formed on the upper surface of the ring W2.

In step 2, the solvent is ejected from the nozzle 41 and is supplied near the center of the substrate W1 of the processing target W on the rotating table 20, and in addition, DIW is ejected from the first nozzle 51 (continuously from step 1) and is supplied to the upper surface of the ring W2 of the processing target W on the rotating table 20. In step 2, the ejection amount of DIW ejected from the first nozzle 51 is 380 ml/min, the rotation number of the table 20 (first rotation number) is 20 rpm, and the processing time is 240 s. Note that the ejection amount of the solvent ejected from the nozzle 41 is 480 ml/min (unillustrated).

Since the rotation number (rotation speed) of the table 20 is set to be a rotation speed that can hold the solvent on the substrate W1 in a state of liquid film, the adhesive may easily react with the solvent. The processing time is set to be time required for the solvent to dissolve a laser absorbing layer which will be described later. The ejection amount of the solvent is set to be a supply amount that can sufficiently dissolve the laser absorbing layer in the aforementioned set processing time. The ejection amount of the solvent, and the rotation number and the processing time of the table 20 is obtained and set beforehand by experiment.

Figure 5:
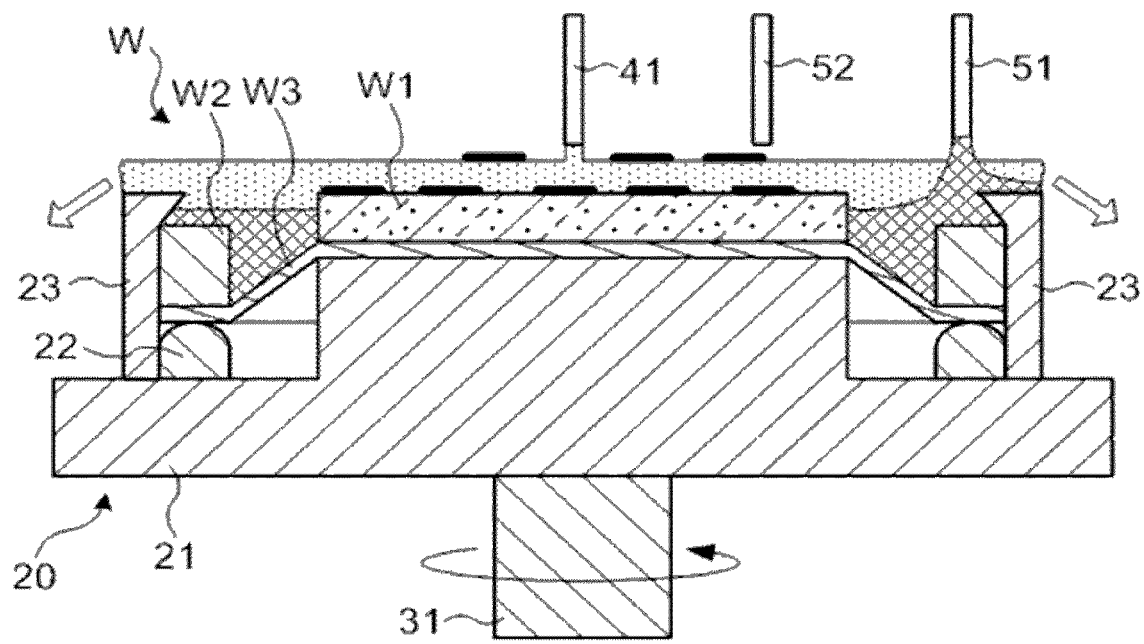
FIG. 5 is a second diagram describing a liquid supplying according to the first embodiment.

In step 2, as illustrated in FIG. 5, in a state the liquid film of DIW is present between the substrate W1 and the ring W2 and on the upper surface of the ring W2, the solvent ejected from the nozzle 41 reaches near the center of the substrate W1 of the processing target W on the rotating table 20 and spreads over the entire upper surface of the substrate W1 by the centrifugal force by the rotation of the processing target W. A liquid film of the solvent is formed on the upper surface of the substrate W1, and the adhesive (indicated by the bold black line on the substrate W1 in FIG. 4) on the substrate W1 is eventually dissolved by the solvent. Step 2 is a step for dissolving the adhesive in the substrate W1. The adhesive dissolves and is peeled off from the substrate W1. The adhesive peeled off from the substrate W1 floats in the liquid film of the solvent on the substrate W1. Note that the adhesive on the substrate W1 is peeled off first from portions where the dissolution proceeded fast and floats in the liquid film of the solvent on the substrate W1.

Here, for example, the laser absorbing layer is stacked on the substrate W1 and a laser reacting layer is stacked on the laser absorbing layer on the substrate W1 to form the adhesive. The laser absorbing layer at the substrate W1 side is dissolved by the solvent, and the adhesive is peeled off and removed from the substrate W1. Before the peeling process of a supporting substrate, the device (substrate W1) is supported by the supporting substrate via the adhesive. The adhesive has a double-layer structure (the laser absorbing layer and the laser reacting layer). At the time of peeling off the supporting substrate, when a laser is irradiated from the supporting substrate side, the laser reacting layer is destroyed by the laser. The laser is absorbed by the laser absorbing layer and does not affect the device. When the laser reacting layer is destroyed, the supporting substrate can be peeled off. The destroyed laser reacting layer and the laser absorbing layer, that is, the adhesive remains at the device side. The device is supported by the dicing tape W3 in a state an upper portion (the laser reacting layer) of the destroyed adhesive is exposed on the upper surface. The solvent that is the first processing liquid dissolves the laser absorbing layer among the two layer of the adhesive and removes the laser absorbing layer together with the laser reacting layer on the laser absorbing layer.

Furthermore, in step 2, although DIW ejected from the first nozzle 51 advances toward the upper surface of the ring W2 of the processing target W on the rotating table 20, DIW does not mix with the solvent flown from the upper surface of the substrate W1, reaches the upper surface of the ring W2, and spreads the inner side and the outer side of the ring W2. DIW is a liquid which does not mix with the solvent and which has a specific gravity heavier than the solvent. DIW spread in the inner side of the ring W2 flows between the substrate W1 and the ring W2 and is accumulated in a space surrounded by the substrate W1, the ring W2, and the dicing tape W3. By this, the liquid film of DIW is maintained between the substrate W1 and the ring W2 and is also maintained around the ring W2. Note that, as described above, DIW does not mix with the solvent and has a specific gravity heavier than the solvent. Therefore, when the solvent discharged from the upper surface of the substrate W1 flows into DIW formed between the substrate W1 and the ring W2, the solvent does not mix with the liquid film of DIW formed between the substrate W1 and the ring W2 and flows on the liquid film of DIW (refer FIG. 5).

Normally, in step 2, although the adhesive removed from the substrate W1 floats and is accumulated on the liquid film of the solvent on the substrate W1, some adhesive among the floating adhesive is discharged from the substrate W1 together with the solvent by the flow of the solvent. That is, a part of the adhesive floating on the liquid film of the solvent on the substrate W1 flows together with the solvent flowing on the liquid film of DIW present between the substrate W1 and the ring W2 and on the upper surface of the ring W2 and is discharged from the processing target W. At this time, since the adhesive and the solvent is discharged from the processing target W in a state the adhesive surface of the dicing tape W3 between the substrate W1 and the ring W2 is covered by the liquid film of DIW, the adhesive is suppressed from sticking to the adhesive surface of the dicing tape W3 between the substrate W1 and the ring W2. Since DIW covers the adhesive surface of the dicing tape W3 between the substrate W1 and the ring W2, does not mix with the solvent, and has the specific gravity heavier than the solvent, the adhesive flowing with the solvent flows on the liquid film of DIW between the substrate W1 and the ring W2. Therefore, the adhesive is suppressed from sticking to the adhesive surface of the dicing tape W3 between the substrate W1 and the ring W2. Furthermore, by forming the liquid film of DIW around the chuck pins 23, the adhesive flowing with the solvent flows on the liquid film of DIW around the chuck pins 23, and the adhesive is suppressed from sticking to the chuck pins 23.

In addition, the table 20 supports the processing target W at a position where a height of the upper surface of the ring W2 is lower than a height of the upper surface of the substrate W1. By this, the adhesive removed from the substrate W1 is suppressed from getting caught and remaining on the ring W2, and the discharge efficiency of the adhesive can be improved. Note that in a case the table 20 supports the processing target W at a position where the height of the upper surface of the ring W2 is the same or higher than the height of the upper surface of the substrate W1, the adhesive removed from the substrate W1 may get caught and remain on the ring W2.

In step 3, the solvent is ejected from the nozzle 41 (continuously from step 2) and is supplied near the center of the substrate W1 of the processing target W on the rotating table 20, DIW is ejected from the first nozzle 51 (continuously from step 2) and is supplied to the upper surface of the ring W2 of the processing target W on the rotating table 20, and furthermore, DIW is ejected from the second nozzle 52 and is supplied to the outer circumference end portion of the substrate W1 of the processing target W on the rotating table 20. In step 3, the ejection amount of DIW ejected from the first nozzle 51 is 380 ml/min, an ejection amount of DIW ejected from the second nozzle 51 is 200 ml/min, the rotation number of the table 20 (second rotation number) is 400 rpm, and the processing time is 60 s. Note that the ejection amount of the solvent ejected from the nozzle 41 is 480 ml/min (unillustrated).

When the rotation number of the table 20 is changed to the second rotation number, the ejection amount of DIW is set to be an ejection amount that can cover the adhesive surface of the dicing tape W3 between the substrate W1 and the ring W2. The rotation number (the rotation speed) of the table 20 is set to be a speed that can discharge the adhesive floating on the substrate W1 to the outside of the substrate W1. The processing time is set to be a time required for all of the adhesive to be discharged from the substrate W1 together with the set rotation number of the table 20. The ejection amount of DIW, and the rotation number and the processing time of the table 20 is obtained and set beforehand by experiment.

Figure 6:
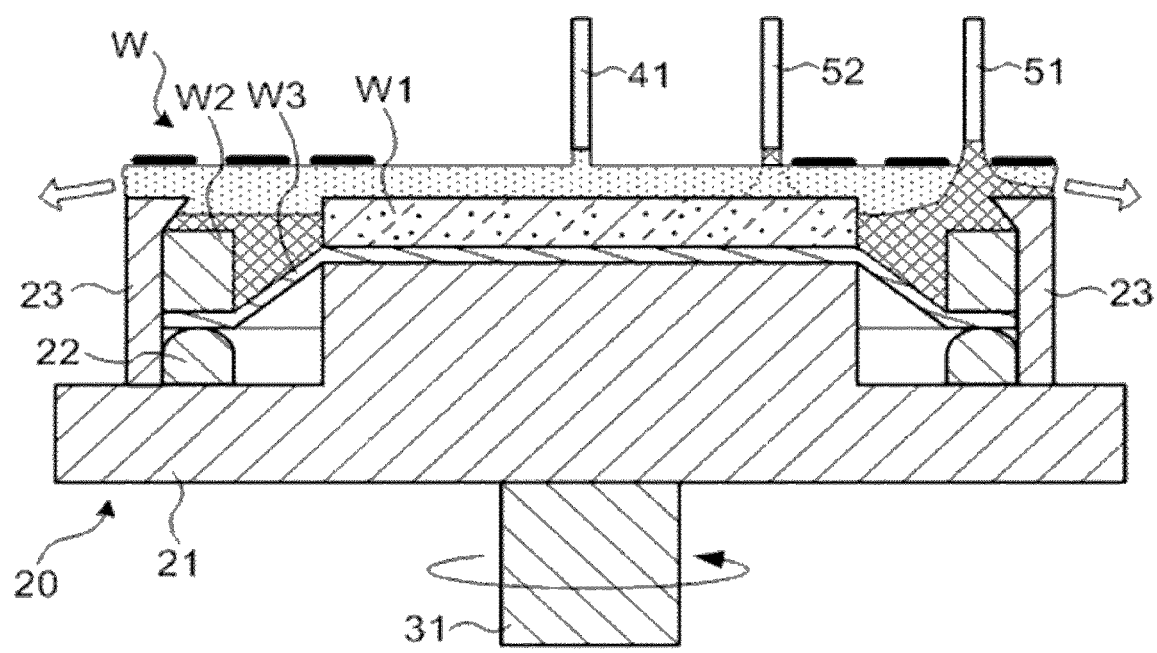
FIG. 6 is a third diagram describing a liquid supplying according to the first embodiment.

In step 3, as illustrated in FIG. 6, the liquid film of DIW is continuously formed between the substrate W1 and the ring W2 of the processing target W, and the liquid film of the solvent is also continuously formed on the upper surface of the substrate W1. The rotation number of the table 20 is increased (from 20 rpm to 400 rpm), and the adhesive floating on the liquid film of the solvent on the processing target W flows together with the solvent flowing on the liquid film of DIW present between the substrate W1 and the ring W2 and on the upper surface of the ring W2 and flows out from the processing target W. Step 3 is a step for discharging the adhesive which is dissolved in step 2 and which is floating on the solvent on the substrate W1 from the processing target W.

Note that, in step 3, the supply of the solvent by the nozzle 41 and the supply of DIW by the first nozzle 51 are the same as the aforementioned step 2, and in addition, DIW is supplied from the second nozzle 52. DIW ejected from the second nozzle 52 does not mix with the solvent flowing from the upper surface of the substrate W1, reaches the outer circumference end portion of the substrate W1 of the processing target W on the table 20, flows between the substrate W1 and the ring W2, and is accumulated in the space surrounded by the substrate W1, the ring W2, and the dicing tape W3. When the rotation number of the table 20 is increased (from 20 rpm to 400 rpm), the centrifugal force is applied, and it becomes difficult for DIW ejected from the first nozzle 51 to flow between the substrate W1 and the ring W2, and the liquid film formed on an exposing surface (the adhesive surface) of the dicing tape W3 becomes thin. Furthermore, a part of the exposing surface would have completely no liquid film. However, since DIW ejected from the second nozzle 52 is supplied between the substrate W1 and the ring W2 so that the thickness (film thickness) of the liquid film of DIW between the substrate W1 and the ring W2 is maintained, the adhesive surface of the dicing tape W3 between the substrate W1 and the ring W2 is surely covered by the liquid film of DIW. By this, even when the rotation number of the table 20 is increased, the adhesive surface of the dicing tape W3 between the substrate W1 and the ring W2 is covered by the liquid film of DIW. As a result, the adhesive floating on the liquid film of the solvent on the substrate W1 flows together with the solvent flowing on the liquid film of DIW present between the substrate W1 and the ring W2 and on the upper surface of the ring W2, and the adhesive is discharged from the processing target W together with the solvent. Therefore, the adhesive removed from the substrate W1 is suppressed from sticking to the adhesive surface of the dicing tape W3 between the substrate W1 and the ring W2.

As described above, since the liquid film of DIW becomes thin or would not be present only with the supply by the first nozzle 51, the formation of the liquid film of DIW is maintained by assisting the liquid amount by the second nozzle 52. Furthermore, the second nozzle 52 ejects DIW toward the outer circumference end portion of the substrate W1 of the processing target W1 to form the liquid film of DIW between the substrate W1 and the ring W2 while considering the effect by the centrifugal force. Even if DIW is supplied to the upper surface of the ring W2 from the second nozzle 52, DIW does not flow to the inner side of the ring W2 and is discharged to the outer side because the centrifugal force is increased when the rotation number becomes the second rotation number. Therefore, DIW is supplied to the outer circumference end portion of the substrate W1 by the second nozzle 52, and flows to the adhesive surface of the dicing tape W3 between the substrate W1 and the ring W2 positioned at the outer side of the outer circumference end portion to form the liquid film of DIW thereto. Note that, in step 3, the solvent (the first processing liquid) is also supplied, and the supply of the solvent is stopped in step 4.

Furthermore, to discharge the adhesive from the processing target W, the rotation number of the table 20 is increased from step 2 (from 20 rpm to 400 rpm). By this, the centrifugal force on the processing target W is increased and the discharge of the adhesive from the processing target W is facilitated, the discharge efficiency to discharge adhesive flowing with the solvent (the discharge efficiency of the adhesive) is improved. That is, in step 2, the liquid film of the solvent is formed on the substrate W1, and the adhesive of the substrate W1 is dissolved and is floated on the liquid film of the solvent, and in step 3, the rotation number of the table 20 is increased, and the adhesive floating on the solvent is discharged from the processing target W together with the solvent. By increasing the rotation number of the table 20 in step 3, the discharge efficiency of the adhesive can be improved. That is, by increasing the rotation number (rotation speed) of the substrate W1, the centrifugal force is produced to discharge the adhesive floating on the surface of the substrate W1 to the outside of the substrate W1 by the centrifugal force. By this, the adhesive can be removed from the surface of the substrate W1. Note that the supply of the solvent to the center of the substrate W1 is continued even when the rotation number of the substrate W1 is increased. This is to suppress the adhesive peeled off from the surface of the substrate W1 from sticking on the surface of the substrate W1 again due to thinning of the liquid film on the surface of the substrate W1 by the centrifugal force. In addition, the discharge efficiency to discharge the adhesive from the substrate W1 is assisted.

In step 4, only IPA is supplied near the center of the substrate W1 of the processing target W on the rotating table 20 from the nozzle 41. In step 4, the rotation number of the table 20 is 400 rpm and the processing time (ejection time) is 60 s. Note that an amount of IPA supplied from the nozzle 41 is 200 ml/min (unillustrated).

In step 4, IPA is supplied to remove the solvent remaining on the substrate W1. Note that to discharge the solvent, it is preferable to use a liquid which can be mixed with the solvent and which has high volatility. The rotation number (rotation speed) of the table 20 is set to be a speed that can discharge the processing liquid remaining on the substrate W1 to the outside of the of the substrate W1. The processing time is set to be a time all the remaining solvent is removed from the substrate W1 together with the set rotation number of the table 20. The ejection amount of DIW, and the rotation number and the processing time of the table 20 is obtained and set beforehand by experiment.

In step 5, drying by fast rotation is performed in a state no liquid is supplied. In step 5, the rotation number of the table 20 is 1000 rpm, and the processing time is 50 s. The rotation number and the processing time required to dry the substrate W1 is obtained and set beforehand by experiment.

In step 6, to stop the drying by the fast rotation, the rotation speed is slowed in the state no liquid is supplied. In step 6, the rotation number of the table 20 is 50 rpm, and the processing time is 10 s.

In the aforementioned substrate processing process, in step 2, the first nozzle 51 ejects DIW toward the upper surface of the ring W2 of the processing target W on the table 20 rotated by the rotation mechanism 30 and supplies DIW between the substrate W1 and the ring W2 of the processing target W. By this, the adhesive surface of the dicing tape W3 between the substrate W1 and the ring W2 and the upper surface of the ring W2 is covered by the liquid film of DIW. In this state, the nozzle 41 ejects the solvent near the center of the substrate W1 of the processing target W on the table 20 rotated by the rotation mechanism 30. Furthermore, in step 3, when the rotation number of the table 20 increases, the second nozzle 52 ejects DIW toward the outer circumference end portion of the substrate W1 of the processing target W1 on the table 20 rotated by the rotation mechanism 30 and supplies DIW between the substrate W1 and the ring W2 of the processing target W. By this, even when the rotation number of the table 20 is increased to, for example, 100 rpm or more (fast rotation) and the thickness of the liquid film of DIW between the substrate W1 and the ring W2 is thinned, DIW is supplied between the substrate W1 and the ring W2 and the thickness of the liquid film of DIW between the substrate W1 and the ring W2 is maintained. Therefore, a state the adhesive surface of the dicing tape W3 between the substrate W1 and the ring W2 is covered by the liquid film of DIW is surely maintained.

Accordingly, the adhesive surface of the dicing tape W3 between the substrate W1 and the ring W2 and the upper surface of the ring W2 is surely covered by the liquid film of DIW during the supply of the solvent. By this, even when the adhesive removed from the substrate W1 is discharged from the substrate W1 together with the solvent, the adhesive removed from the substrate W1 is suppressed from sticking to the adhesive surface of the dicing tape W3 between the substrate W1 and the ring W2 and the upper surface of the ring W2. Therefore, since the adhesive sticking to the adhesive surface of the dicing tape W3 and the upper surface of the ring W2 is suppressed from sticking to the substrate W1 from the dicing tape W3 and the ring W2 during the carrying process or the dicing process (post process), etc., so that the contamination of the substrate W1 is suppressed, the substrate quality is improved.

Here, for example, when the first nozzle 51 supplies DIW to the outer circumference end portion of the substrate W1, DIW spreads to the central direction from the end surface side of the substrate W1. That is, in the first rotation number, the performance that can discharge DIW to the outer circumference of the substrate is not satisfied due to the weak centrifugal force. Therefore, if DIW spreads to the central direction of the substrate W1, it inhibits the solvent supplied to the center of the substrate W1 in step 2 from spreading to the outer circumference of the substrate W1, and the solvent may not react with the adhesive on the outer circumferential portion of the substrate W1. As described above, DIW does not mix with the solvent that is the first processing liquid and has the specific gravity heavier than the solvent that is the first processing liquid. Therefore, if DIW spreads to the central direction from the end surface side of the substrate W1, the solvent supplied to the center of the substrate W1 does not mix with DIW and flows on the DIW near the outer circumference of the substrate W1. That is, it is difficult for the solvent to contact with the adhesive on the substrate W1 near the outer circumference of the substrate W1, and the solvent cannot be supplied to the adhesive on the substrate W1. That is, the reason why the supply position of DIW is changed in accordance with the rotation number of the table 20 is to spread the solvent that is the first processing liquid supplied on the substrate W1 to the outer circumference of the substrate W1 without being inhibited by DIW, to perform sure peeling off of the adhesive on the substrate W1, and to suppress the sticking of the adhesive to the adhesive surface of the dicing tape W3 between the substrate W1 and the ring W2, as described above.

As described above, according to the first embodiment, the processing target W is supported by the table 20, the table 20 is rotated by the rotation mechanism 30, the liquid (for example, DIW) which does not mix with the first processing liquid (for example, solvent) and which has the specific gravity heavier than the first processing liquid is ejected to the upper surface of the ring W2 of the processing target W supported by the table 20, or the outer circumference end portion of the substrate W1 of the processing target W supported by the table 20, supplies the liquid between the substrate W1 and the ring W2 of the processing target W, and supplies the processing liquid to the upper surface of the substrate W1 of the processing target W supported by the rotating table 20 in the state the liquid has been supplied between the ring W2 and the substrate W1 of the processing target W.

That is, the liquid which does not mix with the first processing liquid and which has the specific gravity heavier than the first processing liquid flows between the ring W2 and the substrate W1, and the adhesive surface of the dicing tape W3 between the substrate W1 and the ring W2 is covered by the liquid film of DIW. Accordingly, since the adhesive removed from the substrate W1 is discharged from the processing target W1 together with the first processing liquid flowing on the liquid film of DIW present between the substrate W1 and the ring W2 and on the upper surface of the ring W2, the adhesive is suppressed from sticking to the adhesive surface of the dicing tape W3 between the substrate W1 and the ring W2 at that time. Therefore, the adhesive sticking to the adhesive surface of the dicing tape W3 is suppressed from sticking to the substrate W1 from the dicing tape W3 during the post process such as carrying process or the dicing process, so that the contamination of the substrate W1 is suppressed, and the substrate quality is improved.

Furthermore, the table 20 supports the processing target W at the position where the height of the upper surface of the ring W2 is lower than the height of the upper surface of the substrate W1, so that the discharge efficiency of the adhesive can be improved, and the upper surface of the ring W2 can be covered by the liquid film. By this, the adhesive sticking to the adhesive surface of the dicing tape W3 and the upper surface of the ring W2 is suppressed from sticking to the substrate W1 from the dicing tape W3 and the ring W2 during the post process such as carrying process or the dicing process, so that the contamination of the substrate W1 is surely suppressed, and the substrate quality is improved.

In addition, DIW is supplied from the second nozzle 52. Since the liquid film of DIW becomes thin or would not be present only with the supply by the first nozzle 51, the formation of the liquid film of DIW is maintained by assisting the liquid amount by the second nozzle 52. Furthermore, the second nozzle 52 ejects DIW toward the outer circumference end portion of the substrate W1 of the processing target W1 to form the liquid film of DIW between the substrate W1 and the ring W2 while considering the effect by the centrifugal force. By this, since the thickness (film thickness) of the liquid film of DIW between the substrate W1 and the ring W2 is maintained, the adhesive surface of the dicing tape W3 between the substrate W1 and the ring W2 is surely covered by the liquid film of DIW during the supply of the solvent. By this, even when the rotation number of the table 20 is increased, the adhesive surface of the dicing tape W3 between the substrate W1 and the ring W2 is surely covered by the liquid film of DIW. As a result, the adhesive floating on the liquid film of the solvent on the substrate W1 flows together with the solvent flowing on the liquid film of DIW present between the substrate W1 and the ring W2 and on the upper surface of the ring W2, and the adhesive is discharged from the processing target W together with the solvent. Therefore, the adhesive removed from the substrate W1 is suppressed from sticking to the adhesive surface of the dicing tape W3 between the substrate W1 and the ring W2.

Second Embodiment

A second embodiment will be described with the reference to FIGS. 7 and 8. Note that, in the second embodiment, differences (nozzle angle changing) relative to the first embodiment is described, and other descriptions are omitted.

Figure 7:
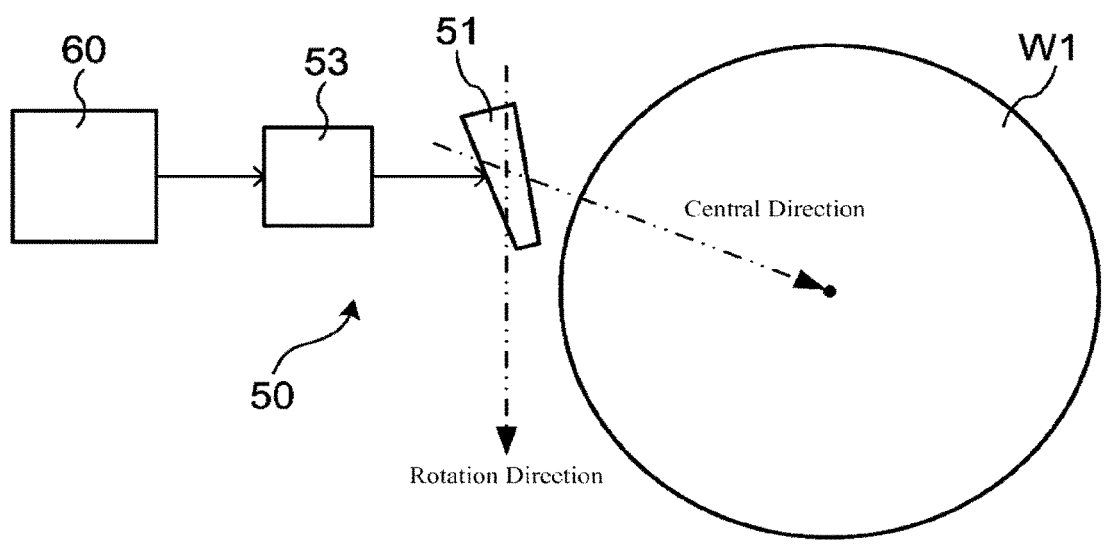
FIG. 7 is a first diagram describing a nozzle angle changing according to a second embodiment.

As illustrated in FIG. 7, a liquid supplier 50 according to the second embodiment includes an angle changer 53, in addition to the components according to the first embodiment. The angle changer 53 can change an inclination angle of the first nozzle 51 and an inclination angle of the second nozzle 52. In below, the first nozzle 51 is described as an example. The first nozzle 51 is inclined toward the rotation direction of the table 20, that is, toward the upstream side of the rotation angle of the processing target W (substrate W1). For example, the angle changer 53 is configured by an angle changing mechanism (unillustrated) having motor and connection member, etc. The angle changer 53 is electrically connected to the controller 60, and the driving thereof is controlled the controller 60.

Figure 8:
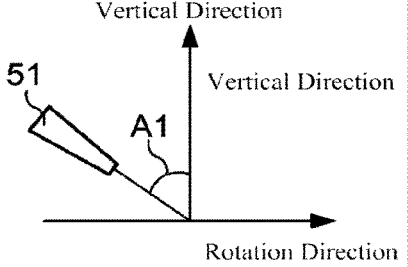
FIG. 8 is a second diagram describing the nozzle angle changing according to the second embodiment.
Figure 8:
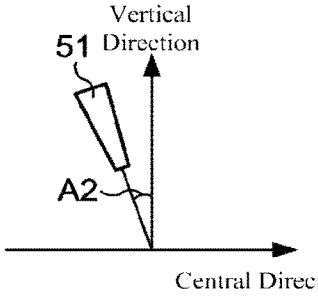
Figure 8:
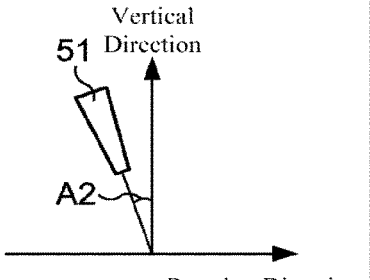
Figure 8:
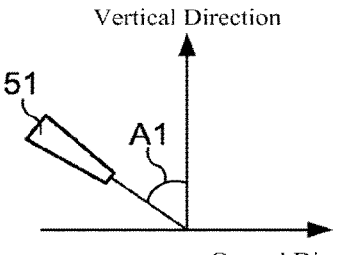

As illustrated in FIG. 8, when the rotation number of the table 20 is the first rotation number (for example, 20 rpm) (slow), a nozzle angle relative to the vertical direction in the plane parallel with the rotation direction is A1 degree (nozzle angle A1), and a nozzle angle relative to the vertical direction in the plane parallel with the central direction is A2 degree (nozzle angle A2). A2 degree is smaller than A1 degree (A2<A1). When the rotation number of the table 20 is the second rotation number (for example, 400 rpm) (fast), the nozzle angle relative to the vertical direction in the plane parallel with the rotation direction is A2 degree, and the nozzle angle relative to the vertical direction in the plane parallel with the central direction is A1 degree. The angle changer 53 changes an angle at which the first nozzle 51 ejects the liquid (ejection angle) in accordance with the rotation number of the table 20 such that the nozzle angle would be the predefined value. Note that the angle changer 53 also changes an angle at which the second nozzle 52 ejects the liquid.

Here, since the rotation speed (rotation number) of the substrate W1 is slow (first rotation number), the nozzle angle A1 and the nozzle angle A2 are angle at which the liquid film is easily formed between the substrate W1 and the ring W2. However, it is preferable that the DIW does not flow to the substrate W1 side. Accordingly, by increasing the nozzle angle A1 relative to the rotation direction, the discharge of the supplied DIW is facilitated while forming the liquid film between the substrate W1 and the ring W2. Furthermore, by decreasing the nozzle angle A2 relative to the central direction of the substrate W1, the DIW is caused not to flow to the central side of substrate W1.

In addition, the nozzle angle A1 and the nozzle angle A2 are set to maintain the liquid film between the substrate W1 and the ring W2 while the rotation speed of the substrate W1 is increased. As the first embodiment, when the rotation speed of the substrate W1 is increased (second rotation number), the liquid film between the substrate W1 and the ring W2 is discharged by the centrifugal force and the adhesive surface of the dicing tape W3 between the substrate W1 and the ring W2 is exposed. To cover this adhesive surface, the nozzle angle A1 is set to an angle in which the inclination relative to the rotation direction is small, and the nozzle angle A2 is set to an angle in which the inclination relative to the central direction is large.

As described above, according to the second embodiment, the effect as same as the first embodiment can be obtained. Furthermore, by changing the angle at which the first nozzle 51 and the second nozzle 52 ejects the liquid relative to the surface of the processing target W on the table 20 (for example, the upper surface of the substrate W1 and the upper surface of the ring W2) in accordance with the rotation number of the table 20, the liquid can be surely supplied between the substrate W1 and the ring W2 and on the upper surface of the ring W2, and the adhesive surface of the dicing tape W3 between the substrate W1 and the ring W2 and the upper surface of the ring W2 is surely covered by the liquid film of DIW. By this, the adhesive removed from the substrate W1 is surely suppressed from sticking to the adhesive surface of the dicing tape W3 between the substrate W1 and the ring W2 and on the upper surface of the ring W2. Therefore, since the adhesive sticking to the adhesive surface of the dicing tape W3 and the upper surface of the ring W2 is suppressed from sticking to the substrate W1 from the dicing tape W3 and the ring W2 during the carrying process or the dicing process (post process), etc., so that the contamination of the substrate W1 is suppressed, the substrate quality is improved.

Other Embodiments

In the aforementioned description, although the liquid is ejected by the liquid supplier 50 to the upper surface of the ring W2 of the processing target W supported by the table 20, or the outer circumference end portion of the substrate W1 of the processing target W supported by the table 20, the example is not limited thereto, and for example, the liquid may be ejected between the substrate W1 and the ring W2 of the processing target W supported by the table 20. Note that the liquid can be supplied to both of the upper surface of the ring W2 and the outer circumference end portion of the substrate W1 of the processing target W supported by the table 20 at the same time, can be supplied to both on the outer circumference end portion of the substrate W1 and between the substrate W1 and the ring W2 of the processing target W supported by the table 20, and can be supplied to all three of the upper surface of the ring W2, the outer circumference end portion of the substrate W1, and between the substrate W1 and the ring W2 of the processing target W supported by the table 20 at the same time.

Furthermore, in the aforementioned description, although two nozzles of the first nozzle 51 and the second nozzle 52 are provided, the example is not limited thereto, and for example, only the first nozzle 51 may be provided and the first nozzle 51 may be moved by the movement mechanism to be used instead of the second nozzle 52. That is, when the rotation number of the table 20 is the first rotation number, the first nozzle 51 ejects the liquid to the upper surface of the ring W2 of the processing target W on the table 20, and when the rotation number of the table 20 is the second rotation number, the first nozzle 51 ejects the liquid to the outer circumference end portion of the substrate W1 of the processing target W on the table 20. Note that the first nozzle 51 is moved from the position ejecting the liquid to the upper surface of the ring W2 of the processing target W on the table 20 to the position ejecting the liquid to the outer circumference end portion of the substrate W1 of the processing target W on the table 20 before the rotation number of the table 20 is changed from the first rotation number to the second rotation number. In addition, a plurality of one or both of the first nozzle 51 and the second nozzle 52 may be provided at predetermined intervals in the circumferential direction of the substrate W1 and the ring W2.

Moreover, in the aforementioned description, although the inclination angle of the first nozzle 51 and the inclination angle of the second nozzle 52 are the same, the example is not limited thereto, and the angles may be different. Furthermore, the first nozzle 51 and the second nozzle 52 may not be inclined as described above, and may be parallel in the vertical direction. In addition, although the inclination angles of the first nozzle 51 and the second nozzle 52 are changed in accordance with the rotation number of the table 20, a plurality of nozzles with different inclination angles for each rotation number of the table 20 may be provided, and those nozzles may be selected and used in accordance with the rotation number of the table 20 and the inclination angles of the nozzle may be changed in accordance with the rotation number of the table 20.

Although some embodiments of the present disclosure may be described, these embodiments are merely presented as examples and are not intended to limit the scope of claims. These novel embodiments can be implemented by the other various forms, and various omissions, replacements, and modifications may be performed without departing from the scope of claims. These embodiments and the modifications thereof are included in the scope of invention and the abstract, and are included in the invention described in the scope of claims and equivalents thereto.

REFERENCE SIGNS

10: substrate processing apparatus
20: table
30: rotation mechanism
40: processing liquid supplier
50: liquid supplier
W: processing target
W1: substrate
W2: ring
W3: dicing tape

The invention claimed is:

1. A substrate processing apparatus comprising:
a table configured to support a processing target including a substrate, a ring surrounding a surrounding of the substrate, and a dicing tape adhered to a lower surface of the substrate and a lower surface of the ring;
a rotation mechanism configured to rotate the table in a plane;
a liquid supplier configured to ejects a liquid which does not mix with a processing liquid for processing the substrate and which has a specific gravity heavier than the processing liquid to one of an upper surface of the ring of the processing target supported by the table rotating by the rotation mechanism, an outer circumference end portion of the substrate of the processing target supported by the table rotating by the rotation mechanism, and between the substrate and the ring of the processing target supported by the table rotating by the rotation mechanism in accordance with a rotation number of the table to supply the liquid between the substrate and the ring of the processing target; and
a processing liquid supplier configured to supplies the processing liquid to an upper surface of the substrate of the processing target supported by the table rotating by the rotation mechanism in a state the liquid has been supplied between the substrate and the ring of the processing target by the liquid supplier.

2. The substrate processing apparatus according to claim 1, wherein the table supports the processing target so that a height of the upper surface of the ring is lower than a height of the upper surface of the substrate.

3. The substrate processing apparatus according to claim 2, wherein:
when the rotation number of the table is a first rotation number, the liquid supplier ejects the liquid toward the upper surface of the ring of the processing target supported by the table rotated by the rotation mechanism, and when the rotation number of the table is a second rotation number larger than the first rotation number, the liquid supplier ejects the liquid toward the outer circumference end portion of the substrate of the processing target supported by the table rotated by the rotation mechanism or between the substrate and the ring of the processing target supported by the table rotated by the rotation mechanism, and
the first rotation number is set so that the liquid that has been ejected from the liquid supplier and has reached the upper surface of the ring of the processing target flows between the substrate and the ring of the of the processing target supported by the table rotated by the rotation mechanism.

4. The substrate processing apparatus according to claim 3, wherein the liquid supplier changes an angle for ejecting the liquid relative to the processing target supported by the table in accordance with the rotation number of the table.

5. The substrate processing apparatus according to claim 1, wherein:
when the rotation number of the table is a first rotation number, the liquid supplier ejects the liquid toward the upper surface of the ring of the processing target supported by the table rotated by the rotation mechanism, and when the rotation number of the table is a second rotation number larger than the first rotation number, the liquid supplier ejects the liquid toward the outer circumference end portion of the substrate of the processing target supported by the table rotated by the rotation mechanism or between the substrate and the ring of the processing target supported by the table rotated by the rotation mechanism, and
the first rotation number is set so that the liquid that has been ejected from the liquid supplier and has reached the upper surface of the ring of the processing target flows between the substrate and the ring of the of the processing target supported by the table rotated by the rotation mechanism.

6. The substrate processing apparatus according to claim 5, wherein the liquid supplier changes an angle for ejecting the liquid relative to the processing target supported by the table in accordance with the rotation number of the table.

7. A substrate processing method comprising:
a process of supporting a processing target including a substrate, a ring surrounding a surrounding of the substrate, and a dicing tape adhered to a lower surface of the substrate and a lower surface of the ring by a table;
a process of rotating the table in a plane by a rotation mechanism;
a process of ejecting a liquid which does not mix with a processing liquid for processing the substrate and which has a specific gravity heavier than the processing liquid to one of an upper surface of the ring of the processing target supported by the table rotating by the rotation mechanism, an outer circumference end portion of the substrate of the processing target supported by the table rotating by the rotation mechanism, and between the substrate and the ring of the processing target supported by the table rotating by the rotation mechanism in accordance with a rotation number of the table to supply the liquid between the substrate and the ring of the processing target by a liquid supplier; and
a process of supplying the processing liquid to an upper surface of the substrate of the processing target supported by the table rotating by the rotation mechanism in a state the liquid has been supplied between the substrate and the ring of the processing target by the liquid supplier by a processing liquid supplier.

8. The substrate processing method according to claim 7, wherein the table supports the processing target so that a height of the upper surface of the ring is lower than a height of the upper surface of the substrate.

9. The substrate processing method according to claim 8, wherein:
when the rotation number of the table is a first rotation number, the liquid supplier ejects the liquid toward the upper surface of the ring of the processing target supported by the table rotated by the rotation mechanism, and when the rotation number of the table is a second rotation number larger than the first rotation number, the liquid supplier ejects the liquid toward the outer circumference end portion of the substrate of the processing target supported by the table rotated by the rotation mechanism or between the substrate and the ring of the processing target supported by the table rotated by the rotation mechanism, and
the first rotation number is set so that the liquid that has been ejected from the liquid supplier and has reached the upper surface of the ring of the processing target flows between the substrate and the ring of the of the processing target supported by the table rotated by the rotation mechanism.

10. The substrate processing method according to claim 9, wherein the liquid supplier changes an angle for ejecting the liquid relative to the processing target supported by the table in accordance with the rotation number of the table.

11. The substrate processing method according to claim 7, wherein:
when the rotation number of the table is a first rotation number, the liquid supplier ejects the liquid toward the upper surface of the ring of the processing target supported by the table rotated by the rotation mechanism, and when the rotation number of the table is a second rotation number larger than the first rotation number, the liquid supplier ejects the liquid toward the outer circumference end portion of the substrate of the processing target supported by the table rotated by the rotation mechanism or between the substrate and the ring of the processing target supported by the table rotated by the rotation mechanism, and
the first rotation number is set so that the liquid that has been ejected from the liquid supplier and has reached the upper surface of the ring of the processing target flows between the substrate and the ring of the of the processing target supported by the table rotated by the rotation mechanism.

12. The substrate processing method according to claim 11, wherein the liquid supplier changes an angle for ejecting the liquid relative to the processing target supported by the table in accordance with the rotation number of the table.

* * * * *